United States Patent [19]

Anderson et al.

[11] Patent Number: 4,599,263
[45] Date of Patent: Jul. 8, 1986

[54] COMPONENT ASSEMBLY AND TAPE FOR NONDESTRUCTIVE DEBONDING

[76] Inventors: Edward A. Anderson, 5091 Torida Way, Yorba Linda, Calif. 92682; Ernesto S. Sandi, 1736 Via Palermo, Montebello, Calif. 90640

[21] Appl. No.: 564,942

[22] Filed: Dec. 23, 1983

[51] Int. Cl.$^4$ .............................................. D03D 3/00
[52] U.S. Cl. ..................................... 428/225; 156/70; 428/224; 428/229; 428/257; 428/258; 428/259; 428/901
[58] Field of Search ............... 428/121, 192, 193, 221, 428/224, 225, 257, 343, 901, 238, 247, 258, 259, 229; 156/70

[56] References Cited

U.S. PATENT DOCUMENTS 2,202,013  5/1940  Lougheed ........................... 428/222
2,610,868  9/1952  Flament ................................ 156/70

Primary Examiner—James J. Bell

[57] ABSTRACT

A component assembly (11) and a tape (21) therefor provide for the nondestructive debonding of components (13, 15) bonded by adhesive (17). A thread or woof (19) meanders through the adhesive. When at least one end (27) of the woof is pulled, the adhesive is destroyed so that the components may be separated without component damage. The meandering thread may be a woof woven through multiple filaments (25) to form the tape.

3 Claims, 2 Drawing Figures

COMPONENT ASSEMBLY AND TAPE FOR NONDESTRUCTIVE DEBONDING

BACKGROUND OF THE INVENTION

The present invention relates to bonded component assemblies, and more particularly to a tape product useful for bonding circuit components so as to facilitate eventual nondestructive debonding.

In satellite and other applications, expensive components are necessarily bonded together. When program completion or testing indicates, it is often desirable to recover components for use in a new context. For example, large flatpack hybrids may be bonded to multilayer printed circuit boards, beryllium oxide heat sinks to programmable read only memories (PROMs), ceramic leadless chip carrier (LCC) motherboards to printed wiring boards (PWBs), PROMs to PWBs, etc. Often the components are custom made, and replacement means refabricating from scratch.

Debonding techniques may involve slicing through a bonding agent or prying components apart. These techniques frequently cause damage to one or more components. What is needed is a component assembly which allows ready separation without damage to components. More specifically, a product for bonding expensive electronic components which provides for nondestructive debonding of the components is sought.

SUMMARY OF THE INVENTION

In accordance with the present invention, a thread or woof meanders through an adhesive bonding components. One or both ends of the woof are exposed. The adhesive may be disintegrated by pulling one or both ends so that the components may be separated without damage. The meandering may be an "S" pattern defined by a longitudinally extending series of transversely extending segments.

In accordance with one realization of the invention, the form of the woof is provided by a tape product including the woof and a warp of longitudinally extending weaker filaments. In one embodiment, the tape is impregnated with adhesive. The woof is strong enough, and the adhesive and any warp weak enough, so that the woof can be pulled out of the assembly intact. The segments are placed on a pitch considerably less than the width of the tape so that a square strip of the tape has several segments.

The tape may extend over the area of adhesion. Alternatively, several strips of tape may be used collectively to cover the area of adhesion between the components. In either case, at least one end of each woof extends longitudinally beyond the components to be accessible to a hand or other pulling tool. Preferably, both ends are accessible. The tape may be supplied uncoated or coated with adhesive.

In use, the tape is impregnated with adhesive and placed between the components to be bonded. The ends of the woof are positioned to be accessible by hand or tool without removal of the components. The assembly thus formed is treated, according to the nature of the adhesive, until adhesion is effected.

The accessible ends of the woof may be pulled in opposing directions so as to unravel the tape. In the unravelling process, the relatively small adhesive bits extending through the interstices if the weave are readily destroyed. With little or no additional effort, debonding is effected. Negligible force is applied to the components themselves in the debonding process, so that risk of component destruction is minimized. Thus, a tape product and a component assembly are presented which provide for ready nondestructive debonding of components.

DESCRIPTION OF THE PREFERRED EMBODIMENTS

Figure 1:
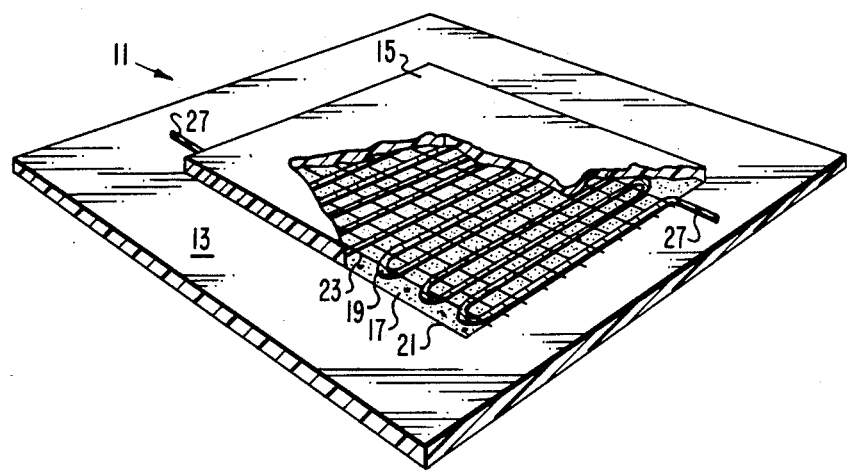
FIG. 1 is a perspective view of a component assembly with portions broken away in accordance with the present invention.

A component assembly 11 comprises a first component 13, a second component 15 and a layer of adhesive 17 inbetween for bonding the components, as illustrated in FIG. 1. In accordance with the present invention, a woof 19 or thread meanders through the adhesive 17 so that when pulled, nondestructive debonding can be effected.

The woof 19 serves to displace would be adhesive along the meandering path. In other words, the adhesive 17 is thinner where displaced by the woof 19. The woof 19 thus defines peninsulas of adhesive 17 which must be disintegrated in order to effect debonding. To facilitate disintegration, the maximum longitudinal extent of each peninsula is kept relatively small. The illustrated "S" pattern of the woof 19 provides for small maximum longitudinal extents for a given pitch.

Figure 2:
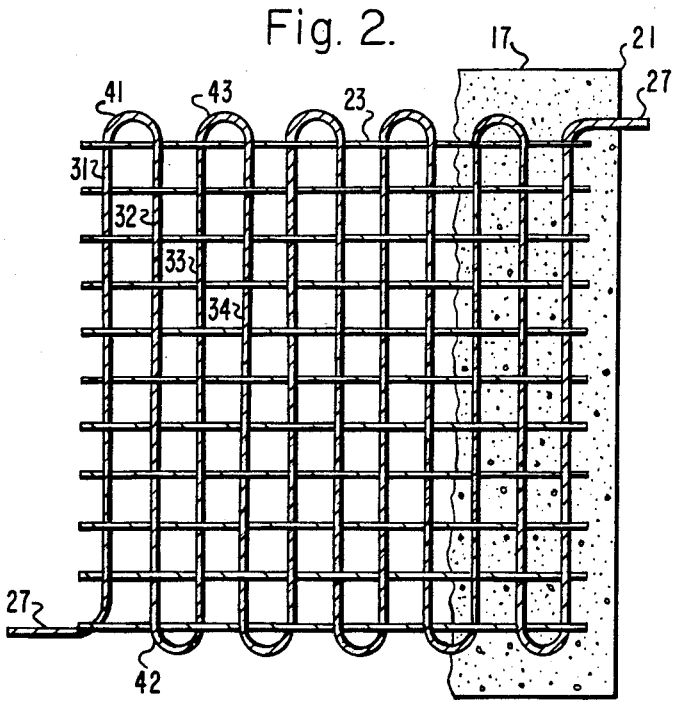
FIG. 2 is plan view of a tape in accordance with the present invention.

It is convenient, and in accordance with one realization of the present invention, to supply the woof 19 in the form of a prefabricated tape 21, illustrated in FIG. 2. The tape 21 includes the woof 19 woven through a warp 23. The warp 23 may consist of substantially longitudinally extending filaments 25. In this configuration, the woof includes a longitudinally extending series of transversely extending segments 31, 32, 33, 34 . . . , separated by turns 41, 42, 43 . . . . The tape 21 may be supplied uncoated or impregnated with adhesive 17.

The pitch of the woof 19, in its "S" configuration, is selected to accomplish both effective bonding and debonding. The pitch must be great enough so that sufficient adhesive is available for bonding, and for heat transfer in applications where the adhesive is so used. The pitch is small enough so that the woof 19 does not break when pulled with the force necessary to effect disintegration of the adhesive 17. The appropriate pitch is thus a function of the strength of the woof 19, the strength of the adhesive 17, the strength of the warp 23, if included, and any limits on the pulling force to be applied to remove the warp 23.

The woof 19 is chosen to be of high strength and small diameter. The small diameter permits more uniform and reliable adhesion and heat transfer between components. The strength must be ample, perhaps at least ten times the average tensile strength of the filaments, to assure the woof 19 does not break during debonding. The woof 19 should also be free of defects which could affect its aggregate strength. The woof 19 may be elastic or inelastic. More force is required to effect debonding with an inelastic woof 19; however, smaller diameters are obtainable with inelastic woofs.

The warp 23 is constituted by filaments 25 much weaker than the woof 19 so that its removal is not impeded. The transverse pitch of the warp 23 is selected to permit adhesion and heat transfer while providing support for the desired form of the woof 19.

If the woof segments 31, 32, 33, 34 . . . are too long, or if the tape 21 is too wide, there is a danger that the woof 19 may bunch and snag when pulled, increasing the probability of breakage. Accordingly, the width of the tape 21 is limited to avoid bunching. Strips of tape 21 can be placed side by side to effect greater transverse coverage. Where multiple strips are used, at least one end of each strip should be accessible.

Multiple strips should be closely spaced. Otherwise the gaps between might include adhesive which would not be destroyed as the woofs are removed. In the absence of adhesive in the gaps, heat transfer between components would be impeded. Furthermore, the gaps could serve as a trap for cleaning solvents and other materials which might impede performance. For example, trapped cleaning solvents could produce destructive outgasses in satellite applications. As an alternative to multiple strips, a single warp could contain multiple transversely staggered woofs.

In the illustrated assembly, the width of the tape 21 matches the maximum transverse extent of the area of adhesion; the area of adhesion is coextensive with the bonded surface of the second component 15. Ends of the tape 21 protrude beyond the longitudinal ends of the first component 15 so that the woof ends 27 are accessible for pulling. Generally, the magnitude of each protrusion approximates the pitch so that at least one woof segment is outside the area of adhesion and accessible for pulling.

To facilitate debonding, a preheating step may be employed to weaken the adhesive 17 relative to the woof 19. The utility of this step is dependent on the convenience of heating in the context of debonding and the necessity of the step given the relative strengths of the materials.

Actual debonding is effected by pulling one or both ends 27 of each woof 19. Pulling both lowers the strength requirement of the woof 19 and decreases the chances of bunching. On the other hand, the presence of other nearby components—e.g. other electronic chips on a printed wiring board, may make one end inaccessible. Each accessible end 27 may be gripped by a hand, tweezers or other tool to allow pulling, preferably longitudinally away from the component assembly 11. As the woof 19 is pulled, it straightens, disintegrating adhesive 17 and breaking or displacing the warp 23. The action of the woof 19 effectively slices through the adhesive 17 allowing the components 13 and 15 to be separated without damage to the expensive components 13 and 15.

In the illustrated assembly, the tape 21 is about 11 mm wide. The warp 23 is an over-under pattern alternating every row with enough thread to assure the aramid woof 19 can be handled without causing the filaments 25 to unravel before the intended bonding use. The tape 21 is designed so that a sample not less than 50 mm in length can be unraveled by pulling the aramid filament perpendicular to the width of the tape 21 in the same plane as the tape 21 while exerting finger pressure on the tape 21. This allows the aramid thread to completely unravel without breaking or snagging.

The woof 19 is an aramid thread which has a diameter of about 0.005 inches and a tensile strength of approximately 80 pounds. One suitable specification for the woof is provided in Military Specification MILT-87128 (USAF), Amendment 2, Aug. 31, 1982, for "Thread, Para-aramid, Intermediate Modulus," size B. The warp 23 is composed of eleven polyester filaments 25. Each filament 25 has a diameter of about 0.002 inches and tensile strength about 1 pound. One suitable specification for the warp filaments 25 is given in Federal Specification V-T-285D, Oct. 24, 1975, "Thread, Polyester," size 00.

The preferred adhesive 17 is approximately 50% polysulfide and 50% aluminum oxide (for heat transfer). This mixture is solvent resistant to withstand repeated cleanings. Its strength is about 400 psi at room temperature and 50 psi at 200° F. A polyurethane adhesive would provide about twice these figures, requiring a stronger woof. Hot melt adhesives are about 400 psi at room temperature and only 5–10 psi at 200° F. This suggests that they would be particularly well suited to debonding operations involving preheating.

The foregoing are illustrative embodiments. As is clear to those skilled in the art, different materials, patterns, arrangements, and components may be used as the application varies. For example, different woof sizes and materials, weaves, warps, adhesives and components are contemplated. These and other variations and modifications are within the scope of the present invention.

What is claimed is:

1. A tape product comprising:
   plural longitudinally extending filaments; and
   a woof woven transversely through said longitudinally extending threads, said woof including successive transverse segments spaced longitudinally from one another, said transverse segments collectively spanning the longitudinal extent of said longitudinally extending filaments, said woof having a tensile strength greater than the average tensile strength of said filaments.

2. A tape product comprising:
   plural longitudinally extending filaments; and
   a woof woven transversely through said longitudinally extending filaments, said woof including successive transverse segments spaced longitudinally from one another on a pitch substantially less than the width of the tape, each said transverse segment extending substantially the width of said tape, said transverse segments collectively spanning the longitudinal extent of said longitudinally extending filaments, said woof having a tensile strength at least ten times the average tensile strength of said filaments.

3. The tape product of claim 2 further comprising adhesive coating said woof and filaments.

* * * * *